United States Patent
Campbell et al.

(10) Patent No.: US 11,044,819 B2
(45) Date of Patent: Jun. 22, 2021

(54) HEATING OF PRINTED CIRCUIT BOARD CORE DURING LAMINATE CURE

(71) Applicant: International Business Machines Corporation, Armonk, NY (US)

(72) Inventors: Eric J. Campbell, Rochester, MN (US); Joseph Kuczynski, North Port, FL (US); Timothy J. Tofil, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/290,294

(22) Filed: Mar. 1, 2019

(65) Prior Publication Data

US 2019/0200463 A1 Jun. 27, 2019

Related U.S. Application Data

(62) Division of application No. 15/172,652, filed on Jun. 3, 2016, now Pat. No. 10,285,283.

(51) Int. Cl.
*H05K 3/46* (2006.01)
*H05K 1/02* (2006.01)
(Continued)

(52) U.S. Cl.
CPC .............. *H05K 3/4611* (2013.01); *H05B 3/00* (2013.01); *H05B 3/26* (2013.01); *H05B 3/265* (2013.01);
(Continued)

(58) Field of Classification Search
CPC ................. H05K 1/0212; H05K 1/167; H05K 2201/09263; H05K 2203/065;
(Continued)

(56) References Cited

U.S. PATENT DOCUMENTS 3,662,150 A 5/1972 Hartung
3,802,974 A 4/1974 Emmel
(Continued)

FOREIGN PATENT DOCUMENTS

CA 2081141 A1 * 5/1993 ........... B23K 20/023
CN 204187922 8/2015
(Continued)

OTHER PUBLICATIONS

"Is it proper to use an internal layer as a heat bed if I want to warm my multilayer PCB?," Electrical Engineering Stack Exchange, available on website: "http://electronics.stackexchange.com/questions/177420/is-it-proper-to-use-an-internal-layer-as-a-heat-bed-if-i-want-to-warm-my-multila" on Jun. 3, 2016.
(Continued)

*Primary Examiner* — Sonya M Sengupta
(74) *Attorney, Agent, or Firm* — ZIP Group PLLC

(57) ABSTRACT

A multilayer printed circuit board (PCB) includes a laminate between a first core and a second core. The first core is located in a middle position of the multi-layer PCB and includes a resistive heating element directly upon a first core substrate. A portion of the resistive heating element protrudes from the multi-layer PCB perimeter. A laminator that fabricates the PCB includes a platen, a power supply, a processor, and memory that has program instructions embodied therewith which are readable by the processor to cause the laminator to position the platen against a surface of the multi-layer PCB and cure the laminate by heating the multi-layer PCB with the platen and cure the laminate by heating the multi-layer PCB with the resistive heating element.

3 Claims, 7 Drawing Sheets

(51) Int. Cl.
*H05K 3/40* (2006.01)
*H05K 1/16* (2006.01)
*B29C 65/02* (2006.01)
*B32B 37/06* (2006.01)
*B29C 65/18* (2006.01)
*H05B 3/26* (2006.01)
*H05B 3/00* (2006.01)

(52) U.S. Cl.
CPC ......... *H05K 1/0212* (2013.01); *H05K 3/4092* (2013.01); *B29C 65/02* (2013.01); *B29C 65/18* (2013.01); *B32B 37/06* (2013.01); *H05K 1/167* (2013.01); *H05K 3/4602* (2013.01); *H05K 2201/09263* (2013.01); *H05K 2203/065* (2013.01); *H05K 2203/068* (2013.01); *H05K 2203/1115* (2013.01); *H05K 2203/1572* (2013.01)

(58) Field of Classification Search
CPC ..... H05K 2203/068; H05K 2203/1115; H05K 2203/1572; H05K 3/4092; H05K 3/4602; H05K 3/4611; B64C 13/18; B64C 27/04; B64C 27/57; G05D 1/0858; H05B 3/00; H05B 3/26; H05B 3/265; B29C 65/02; B29C 65/18; B32B 37/06
USPC .................. 156/272.8, 499, 553, 580, 583.1
See application file for complete search history.

(56) References Cited

U.S. PATENT DOCUMENTS

| | | | |
|---|---|---|---|
| 4,367,115 A | | 1/1983 | Bohn |
| 4,374,316 A | | 2/1983 | Inamori et al. |
| 4,392,909 A | * | 7/1983 | Bohn ...................... B30B 15/34 100/137 |
| 4,689,105 A | | 8/1987 | Fazlin |
| 4,859,271 A | * | 8/1989 | Fazlin ..................... B32B 37/06 156/382 |
| 5,010,233 A | | 4/1991 | Henschen et al. |
| 5,808,259 A | * | 9/1998 | Spinner ................ G01R 1/0408 219/56.22 |
| 5,896,259 A | | 4/1999 | Farwell et al. |
| 6,031,729 A | | 2/2000 | Berkely |
| 6,114,674 A | * | 9/2000 | Baugh .................... H01C 13/00 174/250 |
| 6,606,792 B1 | | 8/2003 | Andresakis |
| 7,049,929 B1 | | 5/2006 | Fjelstad |
| 9,012,811 B2 | | 4/2015 | White |
| 2004/0020687 A1 | * | 2/2004 | Moore ................ H05K 1/0212 174/254 |
| 2004/0075988 A1 | * | 4/2004 | Tatsumi .................. B32B 37/26 361/748 |
| 2011/0132654 A1 | * | 6/2011 | Taketomi ............ H05K 3/4694 174/520 |
| 2011/0134617 A1 | | 6/2011 | Putsch |
| 2017/0354043 A1 | * | 12/2017 | Campbell ............ H05K 1/0212 |

FOREIGN PATENT DOCUMENTS

| | | | | |
|---|---|---|---|---|
| DE | 2754093 A1 | * | 7/1978 | ........... H05K 3/4611 |
| JP | 61069420 A | * | 4/1986 | ............... B30B 7/02 |

OTHER PUBLICATIONS

List of IBM Patents or Patent Applications Treated as Related, filed herewith.

* cited by examiner

HEATING OF PRINTED CIRCUIT BOARD CORE DURING LAMINATE CURE

FIELD OF THE INVENTION

Embodiments of the invention generally relate to printed circuit board (PCB) fabrication and more particularly to heating a PCB core during laminate cure.

DESCRIPTION OF THE RELATED ART

A printed circuit board (PCB) mechanically supports and electrically connects electronic components using conductive tracks, pads and other features etched from electrically conductive sheets laminated onto a non-conductive substrate. Electrical components, such as capacitors, resistors, active devices, chips, or the like are generally soldered on the PCB. PCBs may also contain electrical components formed within the substrate.

PCBs can be single sided wherein one conductive layer is formed upon the substrate; double sided wherein a conductive layer is formed upon the top and bottom of the substrate, or multi-layer. Conductors on different layers may be interconnected to form complex circuits.

In a particular PCB, a PCB core includes a FR-4 glass epoxy substrate and a copper foil conductive layer which may be attached to one or both sides of the FR-4. The copper foil may be etched to remove excess material of the conductive layer thereby forming conductive traces. In multi-layer PCBs, multiple PCB core layers are laminated together with a laminate.

During lamination of a multi-layer PCB, a thermal gradient may exist between the top and bottom of the multi-layer PCB. Depending on the characteristics of the thermal gradient or the thickness of the multi-layer PCB stack, the thermal gradient may result in a laminate internal to the multi-layer PCB having a different degree of cure, relative to a laminate near the top or bottom of the multi-layer PCB. Different degree of laminate curing may result in different laminate material characteristics. For example, the internal laminate may have a different glass transition temperature or different coefficient of thermal expansion (CTE) relative to the laminate near the top or bottom of the multi-layer PCB. When the laminates within the multi-layer PCB have different material characteristics, overall reliability of the multi-layer PCB may be degraded.

SUMMARY

In another embodiment of the present invention, a laminator for fabricating a multi-layer printed circuit board (PCB) is presented. The multi-layer PCB includes a laminate between a first core and a second core. The first core is located in a middle position of the multi-layer PCB and includes a resistive heating element directly upon a first core substrate. A portion of the resistive heating element protrudes from the multi-layer PCB perimeter. The laminator includes a platen, a power supply, a processor, and memory that has program instructions embodied therewith which are readable by the processor to cause the laminator to position the platen against a surface of the multi-layer PCB and cure the laminate by heating the multi-layer PCB with the platen and cure the laminate by heating the multi-layer PCB with the resistive heating element.

These and other embodiments, features, aspects, and advantages will become better understood with reference to the following description, appended claims, and accompanying drawings.

It is to be noted, however, that the appended drawings illustrate only example embodiments of the invention, and are therefore not considered a limitation of the scope of embodiments of the invention.

DETAILED DESCRIPTION

A multi-layer printed circuit board (PCB) includes a laminate between at least one PCB heating core and a PCB signal core. The PCB heating core includes an electrically conductive resistive heating element upon a first core substrate. The PCB signal core includes one or more electrically conductive signal traces, signal planes, power planes, ground places, or the like upon a respective core substrate. During a laminate cure PCB fabrication stage, platens may contact the upper side of the multi-layer PCB and the lower side of the multi-layer PCB and a power supply is electrically connected to the electrically conductive resistive heating element. The laminate is cured with heat transferred by the platens and transferred by the electrically conductive resistive heating element. The PCB heating core may be located within an inner layer of the multi-layer PCB to normalize a thermal gradient across the multi-layer PCB that may result from curing the laminate solely with the platen. As a result of the normalized thermal gradient, the degree of laminate cure and material characteristics of the cured laminate material are more consistent throughout the multi-layer PCB thickness, resulting in improved overall reliability of the multi-layer PCB.

Figure 1:
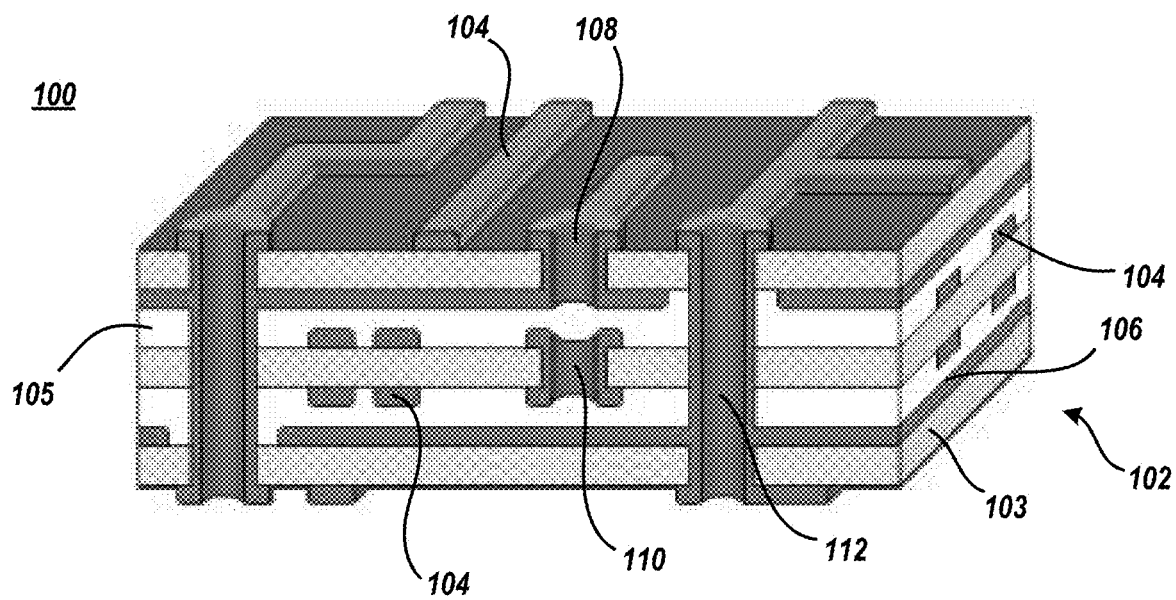
FIG. 1 illustrates an exemplary Printed Circuit Board (PCB) that may utilize or implement various embodiments of the present invention.

FIG. 1 illustrates an exemplary multi-layer PCB 100 that may utilize or implement various embodiments of the present invention. Multi-layer PCB 100 includes multiple layers 102. Multi-layer PCB 100 layers 102 may have a functionally dedicated purpose. For example, a particular layer 102 may be a ground layer 102, power layer 102, signal layer 102, or the like. Multi-layer PCB 100 may further include one or more electrically conductive signal traces 104 and/or signal planes 106, such as a power plane, ground plane, etc. Signal traces 104 and planes 106 may be collectively referred to herein as conductive features which may be electrically connected by various types of vias, such as a blind via 108, buried via 110, through hole via 112, or the like.

The multi-layer PCB 100 may be fabricated by forming cores which include conductive signal traces 104 and/or electrically conductive planes 106 upon the upper and/or lower surfaces of a substrate 103. Adjacent cores are joined by laminate 105. Substrate 103 may be formed generally from a dielectric material known or otherwise utilized in PCB manufacture such as polytetrafluoroethylene (Teflon), FR-2 (phenolic cotton paper), FR-3 (cotton paper and epoxy), FR-4 (woven glass and epoxy), FR-5 (woven glass and epoxy), FR-6 (matte glass and polyester), G-10 (woven glass and epoxy), CEM-1 (cotton paper and epoxy), CEM-2 (cotton paper and epoxy), CEM-3 (non-woven glass and epoxy), CEM-4 (woven glass and epoxy), CEM-5 (woven glass and polyester), Megtron 6 (woven glass and polyphenylene oxide (PPO)), other PPO and woven glass blends, or the like. Laminate 105 includes at least a dielectric thermoset material that once cured joins adjacent cores. The thermoset material may be a thermoset resin, epoxy, or the like. In specific implementations, the laminate 105 may be prepreg, Teflon, FR-4, CEM-1, CEM-3, or the like. The thermoset material within laminate 105 may be partially cured prior to forming the layers 102 of the multi-layer PCB 100. Generally, the various layers 102 of multi-layer PCB 100 may be joined by curing the various one or more laminates 105 under pressure and temperature.

Figure 2:
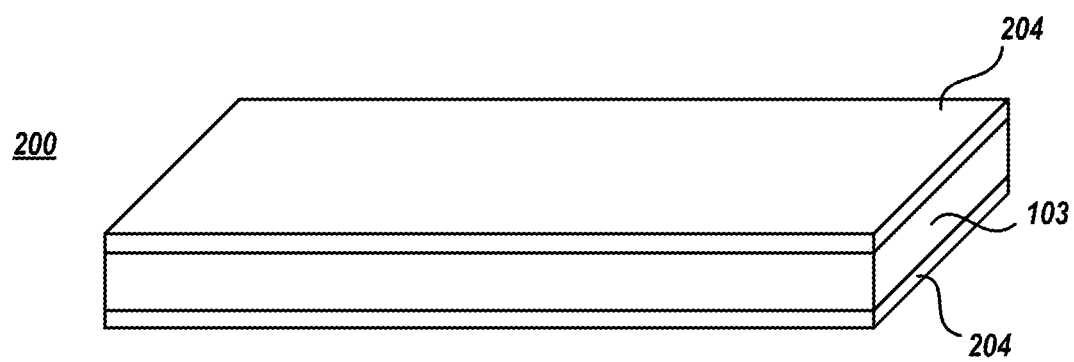
FIG. 2-FIG. 4 illustrate isometric views of exemplary PCB fabrication structures that exist at various stages of PCB fabrication, according to various embodiments of the present invention.

FIG. 2 illustrates an isometric view of an exemplary PCB fabrication structure at a particular stage of an exemplary subtractive PCB fabrication process, according to various embodiments of the present invention. More specifically, FIG. 2 illustrates a PCB core 200 at a particular stage of core 200 fabrication. The exemplary PCB core 200 may be particularly fabricated as a PCB signal core. At the present fabrication stage, PCB core 200 includes an electrically conductive layer 204 formed upon a top surface and upon a bottom surface of a substrate 103. Respective conductive layers 204 may be joined to the substrate 103 by materials and techniques known in PCB fabrication. Electrically conductive layer 204 may be formed by a metal layer, such as copper, or the like.

Figure 3:
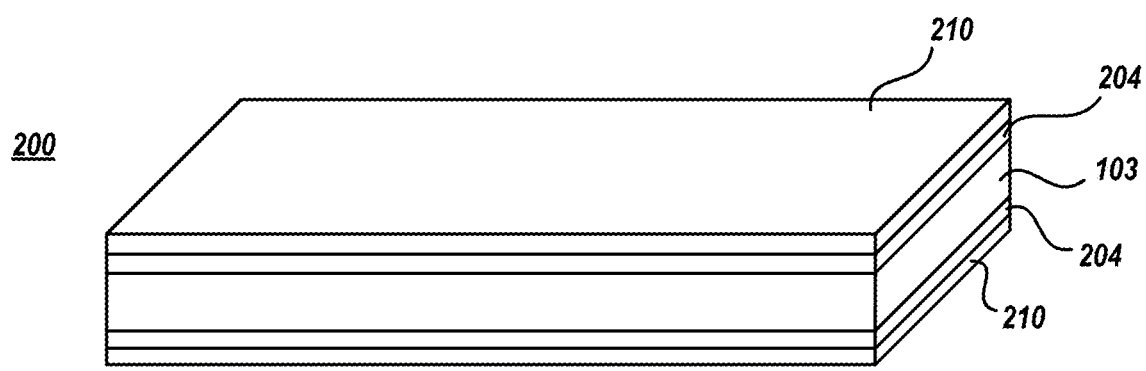

FIG. 3 illustrates an isometric view of an exemplary PCB fabrication structure at a particular stage of an exemplary subtractive PCB fabrication process, according to various embodiments of the present invention. More specifically, FIG. 3 illustrates PCB core 200 at a subsequent stage of core 200 fabrication. At the present fabrication stage, PCB core 200 includes a photosensitive mask 210 formed upon a top surface and upon a bottom surface of respective electrically conductive layers 204. Photosensitive mask 210 may be joined to conductive layer 204 by materials and techniques known in PCB fabrication. Photosensitive mask 210 may be formed by a photoresist material, or the like.

A pattern is transferred to photosensitive mask 210 by subjecting portions of the photosensitive mask 210 to light. Excess material of the photosensitive mask 210 is subsequently removed such that the patterned photosensitive mask 210 remains. The patterned photosensitive mask 210 generally protects the underlying conductive layer 204 material during a subsequent conductive layer 204 material removal stage such that the unprotected conductive layer 204 material is removed while the protected conductive layer 204 material remains upon substrate 103.

Figure 4:
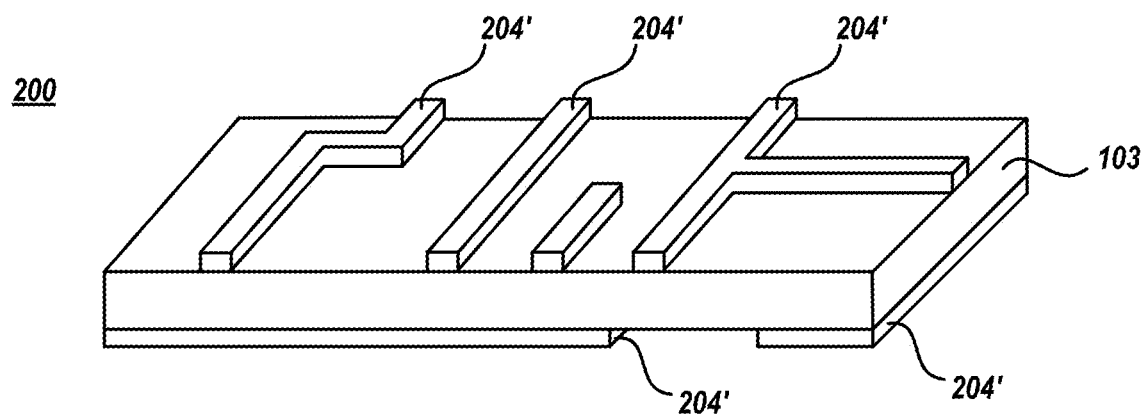

FIG. 4 illustrates an isometric view of an exemplary PCB fabrication structure at a particular stage of an exemplary subtractive PCB fabrication process, according to various embodiments of the present invention. More specifically, FIG. 4 illustrates PCB core 200 at a subsequent stage of core 200 fabrication. At the present fabrication stage, PCB core 200 includes conductive features 204' upon a top surface and upon a bottom surface of substrate 103. The conductive features 204' are formed by the conductive layer 204 material that was protected from removal by the patterned photosensitive mask 210. The conductive features 204' may be a signal trace 104, signal plane 106, or the like. Generally, the conductive features 204' upon the core 200 are associated with the handling of functional signals in normal computing operations that utilize the PCB.

In additive PCB fabrication process, the conductive features 204' may be alternatively fabricated by forming electrically conductive material directly upon the substrate 103. For example, the conductive features 204' may be formed by printing electrically conductive ink upon the substrate 103.

Figure 5:
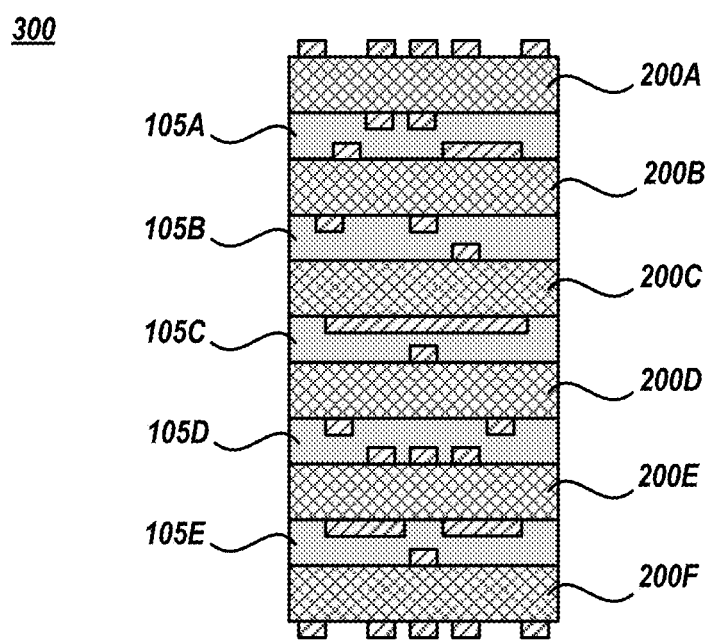
FIG. 5 illustrates an exemplary multi-layer PCB cross section, according to various embodiments of the present invention.

FIG. 5 illustrates an exemplary multi-layer PCB 300 cross section, according to various embodiments of the present invention. Multi-layer PCB 300 includes multiple layers, similar to multi-layer PCB 100 of FIG. 1. Multi-layer PCB 300 may include a plurality of conductive features 204 and/or a plurality of vias. The various layers that form the multi-layer PCB 300 may be referred to herein as a PCB stack. The various layers of multi-layer PCB 300 may be arranged by alternating a PCB core 200 and laminate 105. For example, laminate 105A contacts and joins, subsequent to laminate cure, cores 200A and 200B, laminate 105B contacts and joins, subsequent to laminate cure, cores 200B and 200C, laminate 105C contacts and joins, subsequent to laminate cure, cores 200C and 200D, laminate 105D contacts and joins, subsequent to laminate cure, cores 200D and 200E, and laminate 105E contacts and joins, subsequent to laminate cure, cores 200E and 200F.

Figure 6:
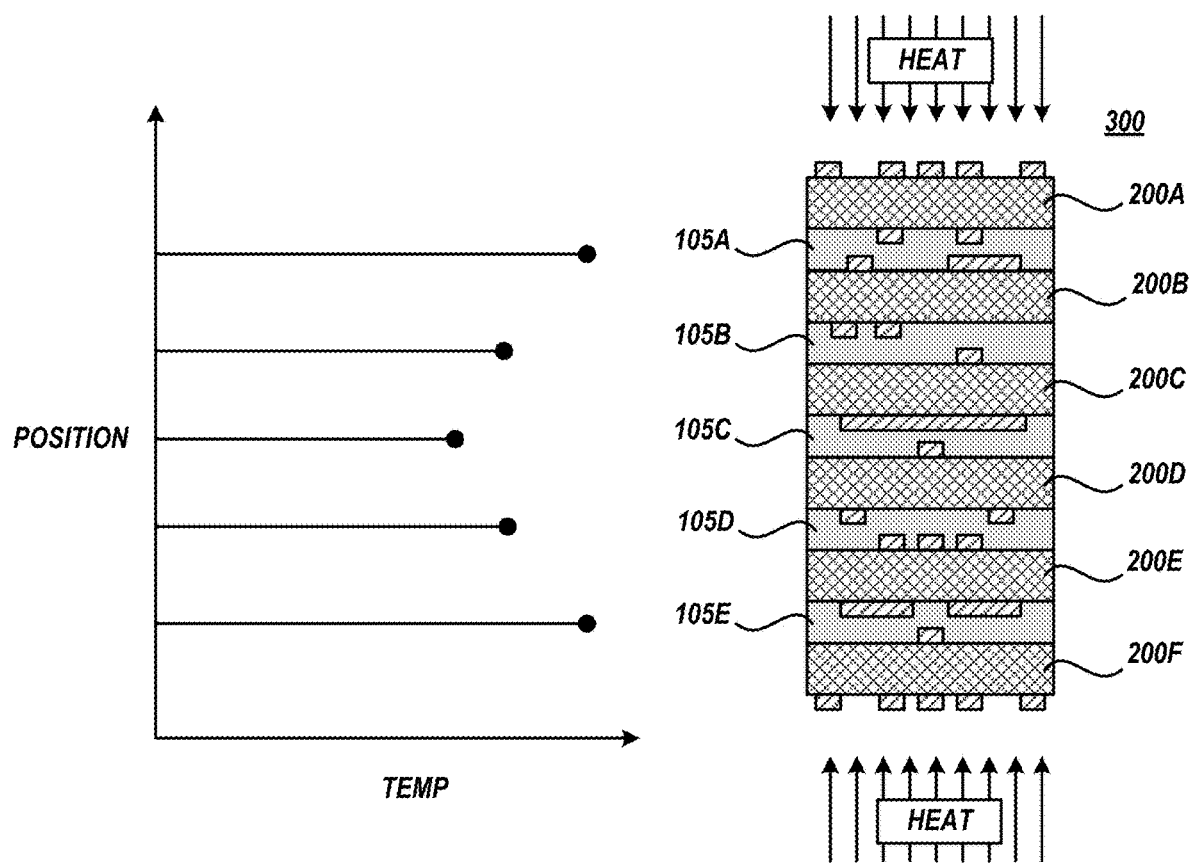
FIG. 6 illustrates a thermal gradient that may exist during a laminate cure fabrication stage of an exemplary multi-layer PCB cross section, according to various embodiments of the present invention.

FIG. 6 illustrates a thermal gradient that may exist within multi-layer PCB 300 during a laminate cure multi-layer PCB 300 fabrication stage, according to various embodiments of the present invention. During laminate cure the PCB 300 is subject to increased pressure and increased temperature to cure the various laminates that exist within the multi-layer PCB 300 stack. In a particular implementation, the multi-layer PCB 300 is inserted into a laminator and an upper platen contacts the upper side of the multi-layer PCB 300 and a lower platen contacts the lower side of the multi-layer PCB 300. The laminator controls the position of the platens to move the platens toward or away from one another. Thus, the laminator may move the platens to contact the upper side and lower side of the multi-layer PCB 300 and may move the platens further toward the multi-layer PCB 300 thereby compressing the multi-layer PCB 300. Likewise, the laminator controls the temperature of the platens. Thus, the laminator heats platens to an increased temperature above ambient to heat the multi-layer PCB 300. Because the platens typically contact either side of the multi-layer PCB 300, a temperature gradient exists throughout the multi-layer PCB 300 stack due to heat transfer from the platen to the innermost layer. For example, at a particular time prior to PCB 300 temperature steady state, core 200A and core 200F nearest the platens have a higher temperature compared to core 200C. Because of the temperature gradient, the temperature of laminate 105A and laminate 105C is likewise different.

The temperature gradient is dependent upon the thickness of the PCB 300, the time the PCB 300 is under pressure and increased temperature, etc. Such variables may be difficult to control to ensure that all laminates within the PCB 300 stack are cured to a similar degree of cure. For example, laminate 105A may be 100% cured since laminate 105A reached a temperature T1 which is equal to or greater than the laminate 105 cure temperature and laminate 105C may be 85% cured because laminate 105A reached a temperature T2 less than T1. Different degree of laminate curing may result in different laminate material characteristics. For example, laminate 105C may have a different glass transition temperature or different CTE relative to laminate 105A. When the laminates within the multi-layer PCB 300 have different material characteristics, overall reliability of the multi-layer PCB 300 may be degraded.

Figure 7:
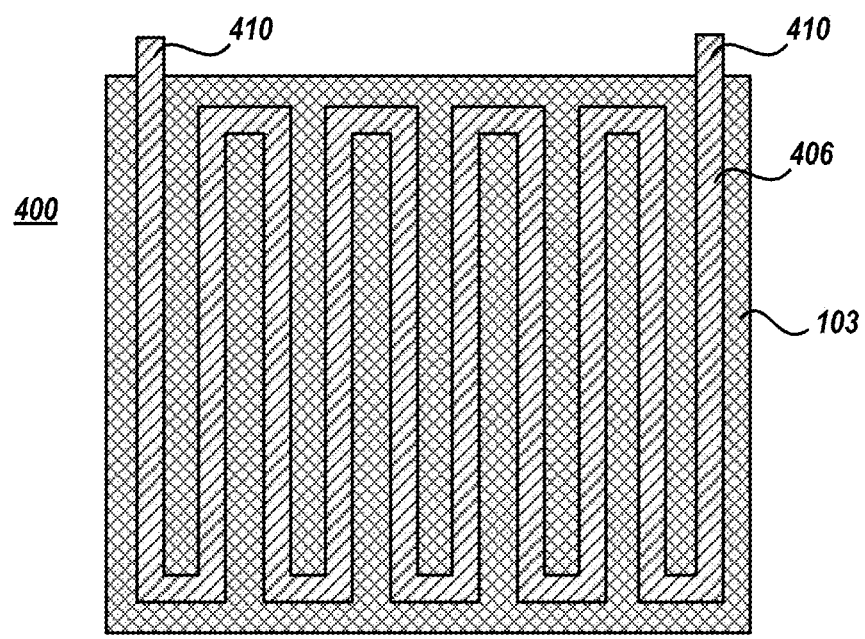
FIG. 7 and FIG. 8 illustrate planar views of exemplary PCB fabrication structures, according to various embodiments of the present invention.
Figure 8:
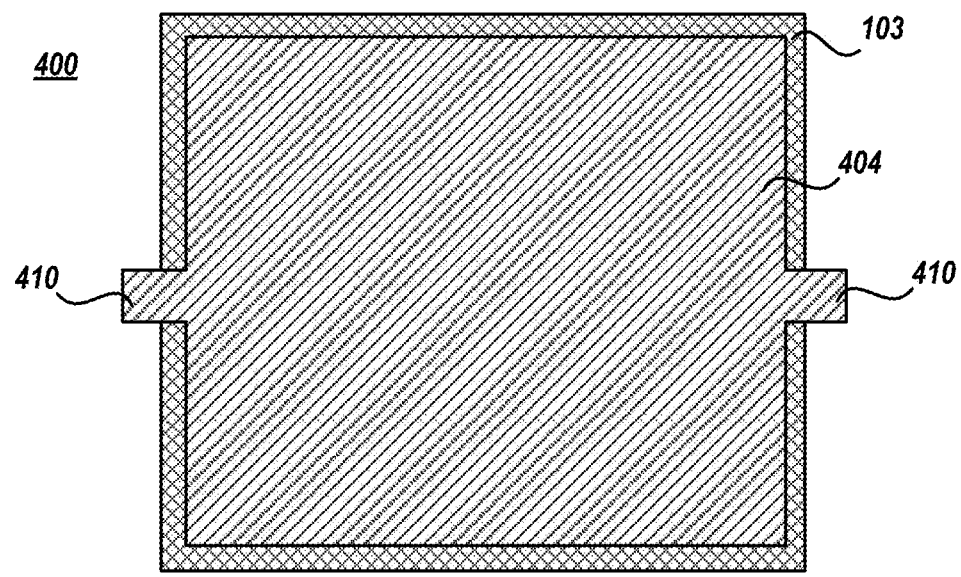

FIG. 7 and FIG. 8 illustrates planar views of an exemplary PCB fabrication structure, according to various embodiments of the present invention. More specifically, FIG. 7 and FIG. 8 illustrate a top view and/or bottom view of PCB heating core 400 at a particular stage of core 400 fabrication. The exemplary PCB heating core 400 may be particularly fabricated as a PCB heating core. At the present fabrication stage, PCB core 400 includes an electrically conductive resistive heating element 406 or heating plane 404 formed upon a top surface and/or upon a bottom surface of a substrate 103. Resistive heating element 406 or heating plane 404 may be fabricated from the same materials and/or techniques utilized to form conductive features 204'. In another embodiment, the material of heating element 406 or heating plane 404 may have a greater electrical resistance (normalized to a particular cross sectional area, length, etc.), relative to the material of conductive features 204'. The particular material and shape of heating element 406 or heating plane 404 may be chosen such that heating element 406 or heating plane 404 reach a similar temperature as the temperature of the platens within a predetermined time period upon the application of current through the heating element 406 or heating plane 404.

FIG. 7 depicts an exemplary heating core 400 that include a heating element 406 configured as a serpentine heating trace upon substrate 103. The heating element 406 generally traverses at least the majority of surface area of substrate 103. In an embodiment, the routing of the heating trace is routed around via or other device keep outs, etc. FIG. 8 depicts an exemplary heating core 400 that includes a heating plane 404. The heating plane 404 generally covers at least the majority of surface area of substrate 103. In a particular embodiment, the heating plane 404 may have similar perimeter dimensions relative to the underlying substrate 103. In an embodiment, one or more clearance holes may be included in heating plane 404 such that vias may extend through the heating plane 404, etc. The heating element 406 and heating plane 404 may include protrusions 410 that extend outside the perimeter of the substrate 103. The protrusions may serve as an interconnection point to electrically connect a power supply that provides electrical potential to heating element 406 and heating plane 404 such that electrical current may flow from one protrusion 410 to the other protrusion 410 through the heating element 406 or heating plane 404 to generally increase the temperature of the heating element 406 or heating plane 404.

Figure 9:
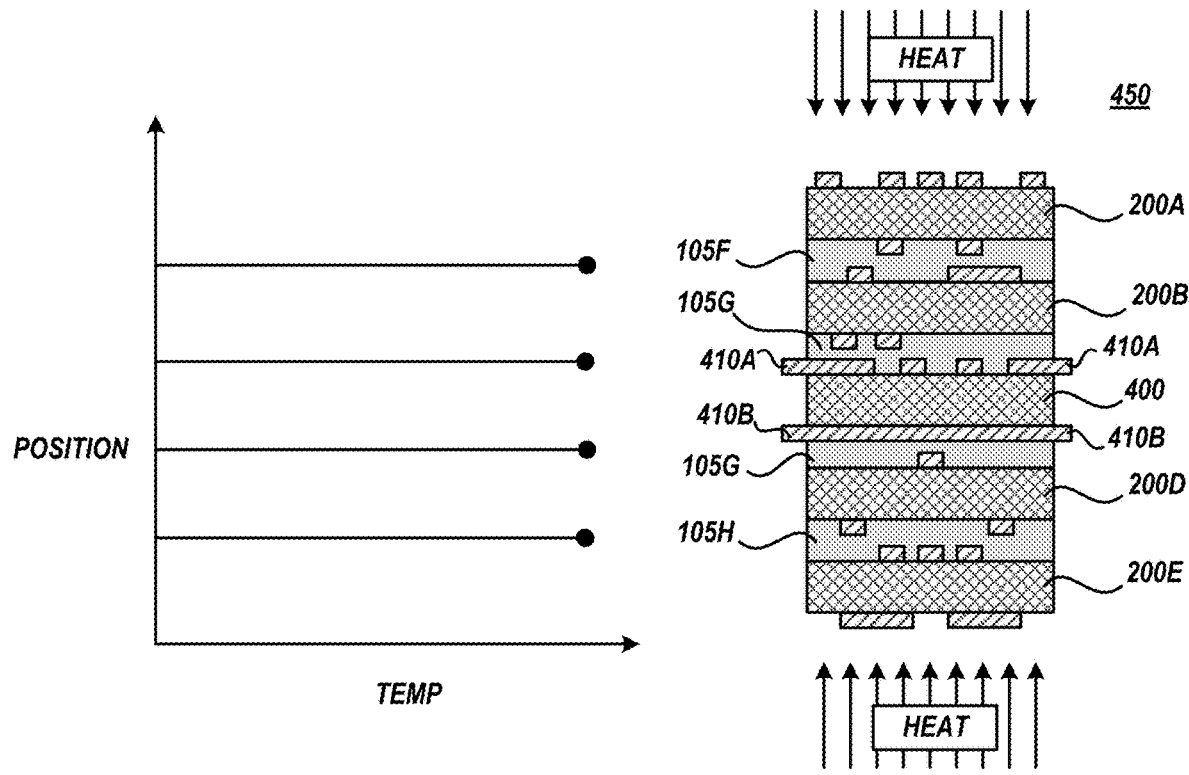
FIG. 9 illustrates a consistent thermal gradient that may exist during a laminate cure fabrication stage of an exemplary multi-layer PCB cross section, according to various embodiments of the present invention.

FIG. 9 illustrates a thermal gradient that may exist within multi-layer PCB 450 during a laminate cure multi-layer PCB 450 fabrication stage, according to various embodiments of the present invention.

Multi-layer PCB 450 includes multiple layers, similar to multi-layer PCB 100 of FIG. 1, with at least one of those layers being heating core 400. Multi-layer PCB 450 may include a plurality of conductive features and/or a plurality of vias. The various layers that form the multi-layer PCB 450 may be referred to herein as a PCB stack. The various layers of multi-layer PCB 450 may be arranged by alternating a PCB core 200 and laminate 105. For example, laminate 105F contacts and joins, subsequent to laminate cure, cores 200A and 200B, laminate 105G contacts and joins, subsequent to laminate cure, cores 200B and heating core 400, laminate 105G contacts and joins, subsequent to laminate cure, heating core 400 and core 200D, and laminate 105H contacts and joins, subsequent to laminate cure, cores 200D and 200E. In a particular embodiment, the PCB 450 may include a single heating core 400 and in other embodiments, the PCB 450 may include multiple heating cores 400. The heating core 400 may be located in the middle of the PCB 450 stack such that the same number of cores 200 are above and below heating core 400, plus or minus a single core 200. More generally, the heating core 400 may be located within the PCB 450 stack such that at least one core 200 is located above or below the heating core 400.

During laminate cure the PCB 450 is subjected to increased pressure and increased temperature provided by at least the heating core 400 to cure the various laminates that exist within the multi-layer PCB 450 stack. In a particular implementation, the multi-layer PCB 450 is inserted into the laminator and an upper platen contacts the upper side of the multi-layer PCB 450 and a lower platen contacts the lower side of the multi-layer PCB 450. An electrical connection is made from the laminator to protrusions 410 that may extend beyond the perimeter of PCB 450. For example, electrical leads, alligator clips, connectors, or the like that are electrically connected to the laminator power supply may be placed into contact with the protrusions 410 such that current may flow across the heating element 406 or heating plane 404.

The laminator controls the position of the platens to move the platens toward or away from one another and may control whether current is passed through heating element 406 or heating plane 404. Thus, the laminator may move the platens to contact the upper side and lower side of the multi-layer PCB 450 and may move the platens further toward the multi-layer PCB 450 thereby compressing the multi-layer PCB 450. Likewise, the laminator controls the temperature of the platens. Thus, the laminator heats platens to an increased temperature above ambient and may heat heating element 406 or heating plane 404 to an increased temperature above ambient to heat the multi-layer PCB 450. In a particular implementation, the temperature of the heating platens is the same as the temperature of the heating element 406 or heating plane 404. In a particular embodiment, the laminator controls both the temperature of the platens and the temperature of the heating element 406 or heating plane 404.

Because heating core 400 is located within the PCB 450 stack and resultantly heats inner portions of the PCB 450 stack, the temperature gradient across the PCB 450 stack is normalized. For example, as is shown in FIG. 9 the temperatures of laminate 105F, 105G, 105H, and 105I reach a similar temperature due to the additional heat source within the PCB 450 stack. Because, the thermal gradient across the PCB 450 may be normalized with the addition of heating core 400, the laminates within the PCB 450 stack are cured to an increased degree of similarity. For example, laminate 105F may be 100% cured since laminate 105F reached a temperature T1 and laminate 105G may be 98% cured because laminate 105G reached a temperature T3 less than T1 but greater than T2. By having a more consistent degree of laminate cure, the laminates within the PCB 450 stack have more similar laminate material characteristics. For example, laminate 105F may have the same glass transition temperature or same CTE relative to laminate 105G and multi-layer PCB 450 reliability may be improved.

Figure 10:
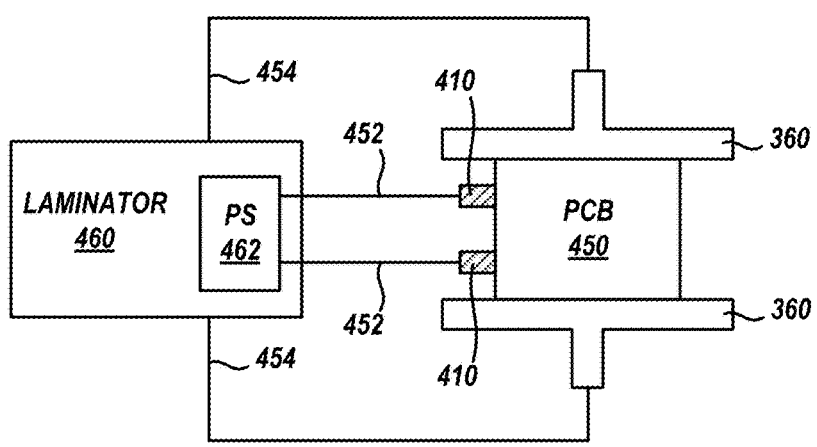
FIG. 10 illustrates an exemplary laminator interconnection topology during a laminate cure fabrication stage of multi-layer PCB, according to various embodiments of the present invention.

FIG. 10 illustrates an exemplary laminator 460 interconnection topology during a laminate cure fabrication stage of multi-layer PCB 450, according to various embodiments of the present invention. Laminator 460 includes platens 360 and a power supply 462. An upper platen 360 contacts the upper surface of PCB 450 and a lower platen 360 contacts the lower surface of PCB 450. Laminator 460 is connected to platens 360 by a connection 454 which includes a position connection and a thermal connection. The position connection allows the laminator 460 to displace the platens 360 toward or away from PCB 450. This way, platens 360 may exert a compressive force upon PCB 450. The position connection may be a hydraulic connection or the like. The thermal connection allows the laminator to heat the platens 360 to a temperature above ambient and typically above the curing temperature of laminate 105. Laminator 460 is connected to heating core 400 by a connection 452 which includes an electrical connection from the power supply 462 to the heating element 406 or heating plane 404. For example, an electrical lead that is connected to the power supply 462 is connected to protrusions 410. The electrical connection allows the laminator 460 to control whether current flows across the heating element 406 or heating plane 404 thereby heating the heating element 406 or heating plane 404.

Figure 11:
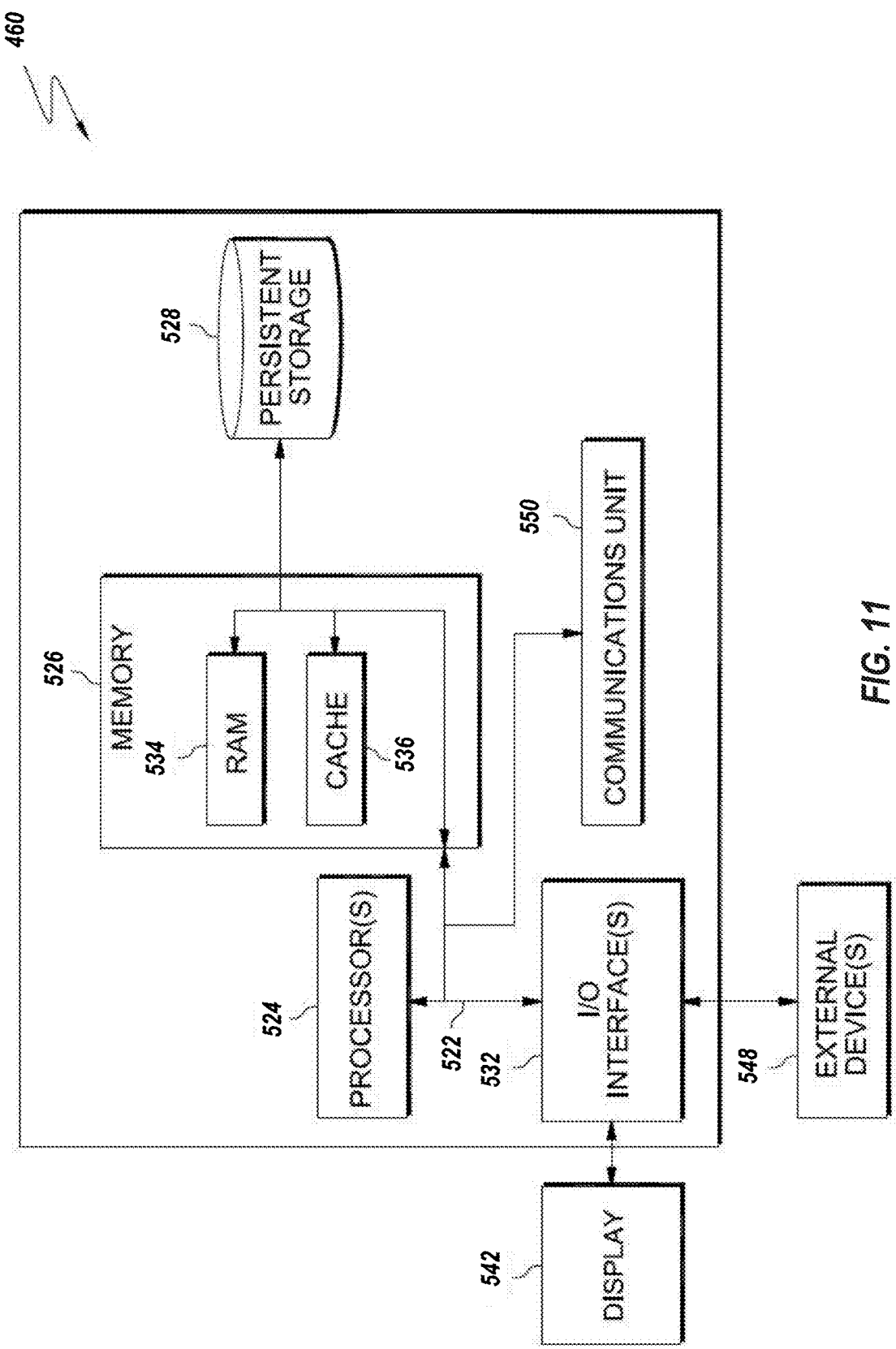
FIG. 11 illustrates of block diagram of a laminator that utilizes various embodiments of the present invention.

FIG. 11 depicts a block diagram of some components of laminator 460 which may also be referred to herein as a machine. It should be appreciated that FIG. 11 provides exemplary implementation of laminator 460 of the present invention and does not imply any limitations with regard to the environment in which different embodiments may be implemented. Many modifications to the depicted environment may be made within the scope of the invention.

Laminator 460 may include a communications bus 522, which provides communications between a processor(s) 524, memory 526, persistent storage 528, communications unit 550, and input/output (I/O) interface(s) 532. Memory 526 and persistent storage 528 are examples of machine readable tangible storage devices. A storage device is any piece of hardware that is capable of storing information, such as, data, program code in functional form, and/or other suitable information on a temporary basis and/or permanent basis. Memory 526 may be, for example, one or more random access memories (RAM) 534, cache memory 536, or any other suitable non-volatile or volatile storage device.

Program instructions are stored in persistent storage 528 for execution by one or more of the respective processors 524 via one or more memories of memory 526. For example, temperature control program instructions may be executed by processor 524 to control the temperature of platens 360, position control program instructions may be executed by processor 524 to control the position of platens 360, current control program instructions may be executed by processor 524 to control whether and the amount of current that flows across heating element 406 or heating plane 404, etc.

Persistent storage 528 can include one or more of flash memory, magnetic disk storage device of an internal hard drive, a solid state drive, a semiconductor storage device, read-only memory (ROM), EPROM, or any other machine readable tangible storage device that is capable of storing program instructions or digital information. The media used by persistent storage 528 may also be removable. For example, a removable hard drive may be used for persistent storage 528. Other examples include an optical or magnetic disk that is inserted into a drive for transfer onto another storage device that is also a part of persistent storage 528, or other removable storage devices such as a thumb drive or smart card.

Communications unit 550 provides for communications with other data processing systems or devices. Communications unit 550 may include one or more network interface cards. Communications unit 550 may provide communications through the use of either or both physical and wireless communications links. In other embodiments, laminator 460 may be devoid of communications unit 550. The various program instructions may be downloaded to persistent storage 528 through communications unit 550.

I/O interface(s) 532 allows for input and output of data with other devices that may be connected to laminator 460. For example, I/O interface 532 may provide a connection to external devices 548 such as a camera, mouse, keyboard, keypad, touch screen, control terminal, and/or some other suitable input device. I/O interface(s) 532 also connects to display 542. Display 542 provides a mechanism to display data to a user and may be, for example, a monitor, touch screen, or the like. Alternatively, display 542 may be integral to laminator 460 and may also function as an input output device.

Figure 12:
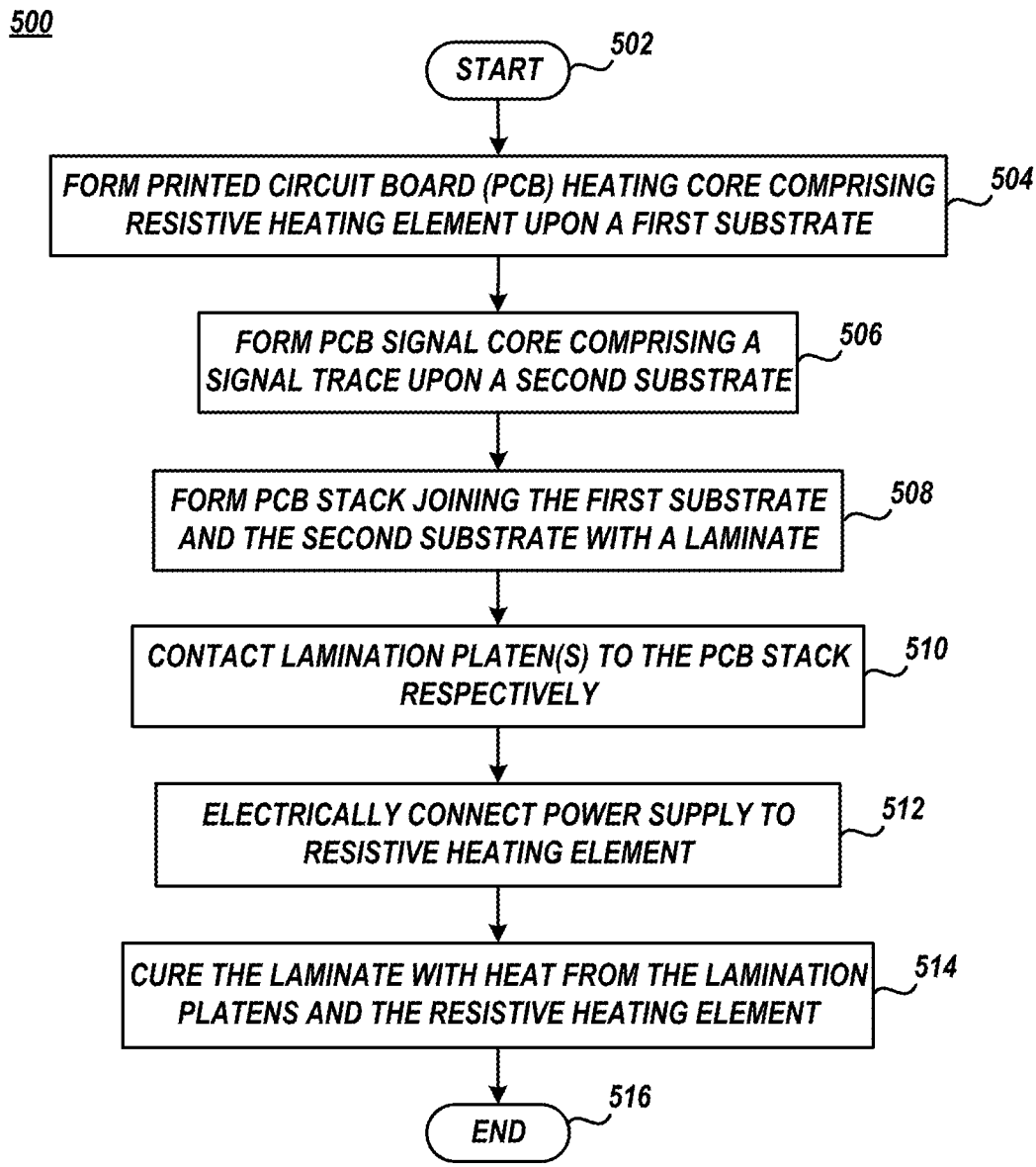
FIG. 12 illustrates an exemplary method of fabricating a multi-layer PCB, according to various embodiments of the present invention.

FIG. 12 illustrates an exemplary method 500 of fabricating a multi-layer PCB, according to various embodiments of the present invention. Method 500 may be utilized by a PCB fabricator utilizing a laminator 460 to normalize thermal gradients that otherwise exist across the multi-layer PCB during a laminate cure fabrication stage. Method 500 begins at block 502 and continues with forming a PCB heating core 400 that includes at least a resistive heating element upon a first substrate 103 associated with the heating core 400. For example, PCB heating core 400 may include a heating element 406 or heating plane 404 upon the associated substrate 103. The heating element may be fabricated upon the substrate 103 by substantive or additive fabrication techniques.

Method 500 may continue with forming a PCB signal core 200 including a conductive feature 204' upon a second substrate 103 associated with the PCB signal core 200 (block 506). The conductive feature 204' may be a signal trace, a signal plane, signal power plane, signal ground plane. The signal power plane is a power plane of the PCB utilized in the generation, handling, transfer, or communication of functional data signals to or from the PCB. Likewise, the signal ground plane is a ground plane of the PCB utilized in the generation, handling, transfer, or communication of functional data signals to or from the PCB. The signal trace is a trace of the PCB utilized in the generation, handling, transfer, or communication of functional data signals to or from the PCB. The signal plane is a plane of the PCB utilized in the generation, handling, transfer, or communication of functional data signals to or from the PCB.

Method 500 may continue with forming a PCB stack by placing a laminate 105 between the PCB heating core 400 and the PCB signal core 200 such that the laminate 105 is located between the first substrate 103 and the second substrate 103 (block 508). Method 500 may continue with contacting an upper platen 360 with the upper side of the PCB stack and a lower platen 360 to the lower side of PCB stack (block 510).

Method 500 may continue with electrically connecting a power supply to the resistive heating element (block 512). For example, conductive leads, alligator clips, connectors, or the like that are connected to a power supply are connected to the restive heating element. In a particular implementation, the conductive leads, alligator clips, connectors, or the like are respectively connected to protrusions 410. In an embodiment, the power supply may be the power supply 462 of the laminator 460.

Method 500 may continue with curing the laminate 105 with heat transferred by the platens 360 and the resistive heating element (block 514). Because heating core 400 is located within the PCB stack, a potential temperature gradient across the PCB stack may be normalized and various laminates within the PCB stack may have a more consistent degree of laminate cure. As a result, the laminates within the PCB stack have more similar laminate material characteristics and multi-layer PCB reliability may be improved.

Embodiments of the present invention may be a system, a method, and/or a machine program product. The machine program product may include a machine readable storage medium (or media) having machine readable program instructions thereon for causing a processor to carry out aspects of the present invention. The machine readable storage medium is a tangible device that can retain and store instructions for use by an instruction execution device. The machine readable storage medium may be, for example, but is not limited to, an electronic storage device, a semiconductor storage device, or any suitable combination of the foregoing. A non-exhaustive list of more specific examples of the machine readable storage medium includes the following: a portable machine diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A machine readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Machine readable program instructions described herein can be downloaded to respective computing/processing devices from a machine readable storage medium or to an external machine or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives machine readable program instructions from the network and forwards the machine readable program instructions for storage in a machine readable storage medium within the respective computing/processing device.

Machine readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The machine readable program instructions may execute entirely on the user's machine, partly on the user's machine, as a stand-alone software package, partly on the user's machine and partly on a remote machine or entirely on the remote machine or server. In the latter scenario, the remote machine may be connected to the user's machine through any type of network, including a local area network (LAN) or a wide area network (WAN), or the connection may be made to an external machine (for example, through the Internet using an Internet Service Provider). In some embodiments, electronic circuitry including, for example, programmable logic circuitry, field-programmable gate arrays (FPGA), or programmable logic arrays (PLA) may execute the machine readable program instructions by utilizing state information of the machine readable program instructions to personalize the electronic circuitry, in order to perform aspects of the present invention.

Aspects of the present invention are described herein with reference to flowchart illustrations and/or block diagrams of methods, apparatus (systems), and machine program products according to embodiments of the invention. It will be understood that each block of the flowchart illustrations and/or block diagrams, and combinations of blocks in the flowchart illustrations and/or block diagrams, can be implemented by machine readable program instructions. These machine readable program instructions may be provided to a processor of a general purpose machine, special purpose machine, or other programmable data processing apparatus to produce a machine, such that the instructions, which execute via the processor of the machine or other programmable data processing apparatus, create means for implementing the functions/acts specified in the flowchart and/or block diagram block or blocks. These machine readable program instructions may also be stored in a machine readable storage medium that can direct a machine, a programmable data processing apparatus, and/or other devices to function in a particular manner, such that the machine readable storage medium having instructions stored therein comprises an article of manufacture including instructions which implement aspects of the function/act specified in the flowchart and/or block diagram block or blocks.

The machine readable program instructions may also be loaded onto a machine, other programmable data processing apparatus, or other device to cause a series of operational steps to be performed on the machine, other programmable apparatus or other device to produce a machine implemented process, such that the instructions which execute on the machine, other programmable apparatus, or other device implement the functions/acts specified in the flowchart and/or block diagram block or blocks.

The flowcharts and block diagrams in the Figures illustrate exemplary architecture, functionality, and operation of possible implementations of systems, methods, and machine program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and machine instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over those found in the marketplace, or to enable others of ordinary skill in the art to understand the embodiments disclosed herein.

What is claimed is:

1. A laminator for fabricating a multi-layer printed circuit board (PCB) comprising a laminate between a first core and a second core, the first core located in a middle position of the multi-layer PCB and comprising a resistive heating element directly upon a first core substrate, wherein a portion of the resistive heating element protrudes from the multi-layer PCB perimeter, the laminator comprising a processor, a memory, a platen connected to the laminator by a position-thermal connection, and a power supply connected to the portion of the resistive heating element by an electrical connection, the memory having program instructions embodied therewith, the program instructions readable by the processor to cause the laminator to:
via the position-thermal connection, position the platen against a surface of the multi-layer PCB; and
via the position-thermal connection, cure the laminate by heating the multi-layer PCB with the platen and, by passing current through the electrical connection and through the resistive heating element, cure the laminate by heating the multi-layer PCB with the resistive heating element.

2. The laminator of claim 1, wherein the resistive heating element is a heating trace upon a first core substrate and wherein the heating trace is serpentine routed upon the first core substrate such that at least a majority of the surface area of the first core substrate is traversed by the heating trace.

3. The laminator of claim 1, wherein the resistive heating element is a heating plane upon a first core substrate and wherein the heating plane is upon at least a majority of the surface area of the first core substrate.

* * * * *